(12) United States Patent
Kishida et al.

(10) Patent No.: US 6,775,920 B2
(45) Date of Patent: Aug. 17, 2004

(54) METHOD OF FABRICATING SEMICONDUCTOR DEVICE COMPRISING SUPERPOSITION INSPECTION STEP

(75) Inventors: Takeshi Kishida, Hyogo (JP); Shigenori Kido, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/437,911

(22) Filed: May 15, 2003

(65) Prior Publication Data

US 2004/0137649 A1 Jul. 15, 2004

(30) Foreign Application Priority Data

Jan. 10, 2003 (JP) ......................................... 2003-004744

(51) Int. Cl.$^7$ .............................................. G01D 21/00
(52) U.S. Cl. ........................................................ 33/645
(58) Field of Search ........................... 33/645; 355/43; 250/492

(56) References Cited

U.S. PATENT DOCUMENTS 6,601,314 B2 * 8/2003 Machida et al. ............... 33/645

FOREIGN PATENT DOCUMENTS

| JP | 05-121284 | 5/1993 |
| JP | 09-266235 | 10/1997 |
| JP | 08-298236 | 11/1998 |

* cited by examiner

Primary Examiner—John F. Niebling
Assistant Examiner—Andre' C. Stevenson
(74) Attorney, Agent, or Firm—McDermott Will & Emery LLP

(57) ABSTRACT

A photolithography step is carried out for exposing/etching a resist film in an etching step. Thereafter a superposition inspection step employing a superposed layer superposition mark and a resist film superposition mark is carried out with a superposition inspection apparatus. In this step, an applied mask confirmation step is simultaneously carried out with the superposition inspection apparatus. Thus, it is possible to provide a method of fabricating a semiconductor device including a superposition inspection step, capable of efficiently confirming an applied mask and improving the fabrication yield for the semiconductor device.

5 Claims, 12 Drawing Sheets

METHOD OF FABRICATING SEMICONDUCTOR DEVICE COMPRISING SUPERPOSITION INSPECTION STEP

BACKGROUND OF THE INVENTION

1. Field of the Invention

The present invention relates to a method of fabricating a semiconductor device, and more specifically, it relates to a method of fabricating a semiconductor device including a superposition inspection step for determining properness/improperness of superposed positions of a superposed layer and a resist film employed as a superpositive layer.

2. Description of the Background Art

In a process of fabricating a semiconductor device, a resist film serving as a superpositive layer having a prescribed pattern is provided on a prescribed layer (hereinafter referred to as a superposed layer) for patterning the superposed layer, and employed as a mask for etching the superposed layer or a layer interposed between the superposed layer and the resist film. Therefore, it is important to properly position the resist film with respect to the superposed layer. Thus, it is also important to pattern the resist film itself.

A method of positioning a resist film with respect to a superposed layer 605 is briefly described with reference to FIGS. 12 to 17. FIG. 12 is a plan view schematically showing the structure of a photomask 500 for transferring prescribed patterns to the resist film. The photomask 500 generally comprises wiring pattern regions 501 and 502 provided with wiring patterns for semiconductor devices and a peripheral pattern region 510, enclosing the wiring pattern regions 501 and 502, corresponding to a dicing line of a wafer.

The peripheral pattern region 510 is provided with a superposition mark 530 employed for determining properness/improperness of superposed positions of the superposed layer 605 and the resist film.

Specific purposes of superposition marks are now briefly described. FIG. 13 is a plan view of superposition marks formed on the superposed layer 605 and the resist film respectively, and FIG. 14 is a sectional view taken along the line XIV—XIV in FIG. 13. An etched layer 611 is provided with a superposed layer superposition mark 611H formed to reflect the shapes of holes 605d provided on the superposed layer 605 as superposed layer superposition marks, while the resist film is provided with a resist film superposition mark 701H transferred from the superposition mark 530 of the aforementioned photomask 500.

A plurality of recesses 611h are arranged to form a square thereby defining the overall shape of the superposed layer superposition mark 611H, and the dimension (H) of one side of the square is about 25 μm. When formed, the etched layer 611 partially drops into the holes 605d provided in the superposed layer 605, thereby forming the recesses 611h. The holes 605d are formed through the same step as that of forming contact holes (not shown) in a wiring region of the etched layer 611.

On the etched layer 611, the resist film superposition mark 701H formed on the resist film is provided inside the superposed layer superposition mark 611H. The dimension (h) of one side of the resist film superposition mark 701H is about 10 μm.

A general etching step 800 employing the superposition mark 611H and 701H is now described with reference to FIG. 15. First, a photolithography step is carried out for exposing/etching the resist film (S810). Thereafter a superposition inspection step is carried out with the superposed layer superposition mark 611H and the resist film superposition mark 701H (S820).

In this superposition inspection step (S820), a superposition inspection apparatus (not shown) is employed for reading the positions of the superposed layer superposition mark 611H and the resist film superposition mark 701h from image information of these superposition marks 611H and 701h and determining whether or not the resist film superposition mark 701H is present on a prescribed position (tolerance position) of the superposed layer superposition mark 611H.

If the resist film superposition mark 701H is present on the prescribed position of the superposed layer superposition mark 611H, the superposition marks 611H and 701H are determined as acceptable and the process makes a transition to a development inspection step (S830). If the superposition marks 611H and 701H are rejectable, the resist film is removed so that a new resist film is applied and exposed/etched (S810).

Then, a resist dimension inspection step (S840) and an applied mask confirmation step (S850) are carried out for thereafter executing an etching step for the etched layer 611 through the resist film (S860) and making a transition to a subsequent step (S870).

However, a method of fabricating a semiconductor device including the aforementioned superposition inspection step has the following problems:

In the process of fabricating a semiconductor device, different photomasks may be employed in the same photolithography step due to revision of the semiconductor device pattern, addition of a type-oriented option or the like.

For example, FIG. 16 is a sectional view of a semiconductor device including a first semiconductor layer 601 provided with conductive regions 602, 603 and 604 and an interlayer dielectric film 605 having contact holes 605a, 605b and 605c reaching the conductive regions 602, 603 and 604 respectively.

Contact plugs 607, 608 and 609 reaching the conductive regions 602, 603 and 604 are provided in the contact holes 605a, 605b and 605c respectively. Further, a wiring layer 611A communicating with the contact plug 607 and a wiring layer 611B communicating with the contact plugs 608 and 609 are formed on the interlayer dielectric film 605. The wiring layers 611A and 611B are patterned through a resist film 701A having patterns corresponding to the wiring layers 611A and 611B.

FIG. 17 is a sectional view of another semiconductor device having a basic structure identical to that of the aforementioned semiconductor device shown in FIG. 16. The semiconductor device shown in FIG. 17 is different from that shown in FIG. 16 in a point that the same is provided with wiring layers 611C and 611D communicating with contact plugs 608 and 609 respectively. Therefore, these wiring layers 611C and 611D are patterned through a resist film 701B having patterns corresponding to a wiring layer 611A and the wiring layers 611C and 611D.

Thus, regions X1 to X4 having partially different wiring structures are interspersed as shown in the plan view of FIG. 12, for example, and the difference between the wiring structures is confirmed in the applied mask confirmation step (S850) carried out in the second half of the etching step 800 shown in FIG. 15.

This is because all superposition marks are generally shaped identically to each other and provided on identical positions of peripheral pattern regions of photomasks having different patterns and hence it is impossible to determine whether or not the applied photomask 500 is correct in the steps S820 to S840 shown in FIG. 15. Thus, correctness of the applied photomask 500 is confirmed in the second half of the etching step 800, leading to hindrance of improvement of the working efficiency.

Further, the applied mask confirmation step (S850) is generally manually carried out offline, leading to reduction of the fabrication yield for the semiconductor device resulting from overlook of incorrectness of the photomask 500.

SUMMARY OF THE INVENTION

An object of the present invention is to provide a method of fabricating a semiconductor device including a superposition inspection step, capable of efficiently confirming an applied mask and improving the fabrication yield for the semiconductor device.

In order to attain the aforementioned object, the inventive method of fabricating a semiconductor device including a superposition inspection step for determining properness/improperness of a superposed position of a resist film formed on a superposed layer as a superpositive layer with a superposition inspection apparatus comprises the following steps:

A first step is carried out for reading information of a superposed layer superposition mark provided on the aforementioned superposed layer. A second step is carried out for reading information of a resist film superposition mark provided on the aforementioned resist film.

Then, a mark position determination step is carried out for reading the positional relation between the aforementioned superposed layer superposition mark and the aforementioned resist film superposition mark from the aforementioned information of the layer superposition mark and the aforementioned information of the resist film superposition mark, for determining properness/improperness of the position of formation of the aforementioned resist film with respect to the aforementioned superposed layer.

A mark determination step is carried out for comparing the aforementioned information of the resist film superposition mark with information of a registered resist film superposition mark previously registered in the aforementioned superposition inspection apparatus thereby determining whether or not the aforementioned resist film superposition mark coincides with the aforementioned registered resist film superposition mark.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a method of fabricating a semiconductor device including a superposition inspection step according to the present invention are now described with reference to FIGS. 1 to 11. Each embodiment is illustrative and not restrictive in all points. In each embodiment, the present invention is applied to a general wiring structure applied to a semiconductor device. In other words, the present invention is not restricted to a specific semiconductor device but is widely applicable to general semiconductor devices.

First Embodiment

A method of fabricating a semiconductor device including a superposition inspection step according to a first embodiment of the present invention is now described with reference to FIGS. 1 to 4.

Figure 1:
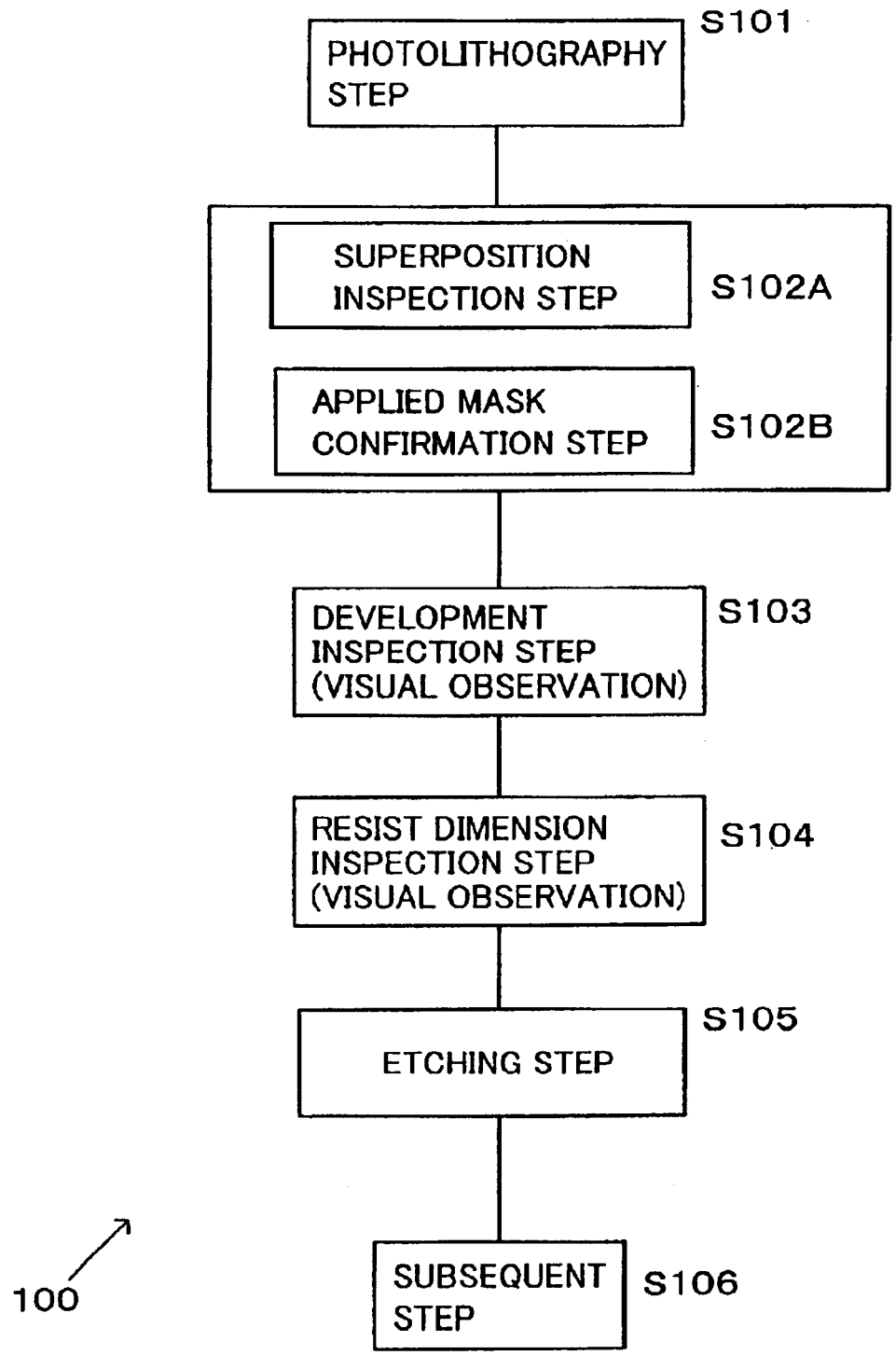
FIG. 1 is a flow chart showing an etching step for a semiconductor device, to which a method of fabricating a semiconductor device including a superposition inspection step according to a first embodiment of the present invention is applied.

Referring to FIG. 1, a photolithography step is first carried out in the etching step 100 according to the first embodiment for exposing/etching a resist film (S101). Thereafter a superposition inspection step employing a superposed layer superposition mark and a resist film superposition mark with a superposition inspection apparatus (S102A). In this step, an applied mask confirmation step is simultaneously carried out with the superposition inspection apparatus (S102B). Thereafter a development inspection step (S103), a resist dimension inspection step (S104) and an etching step (S105) are carried out, for making a transition to a subsequent step (S106).

Figure 15:
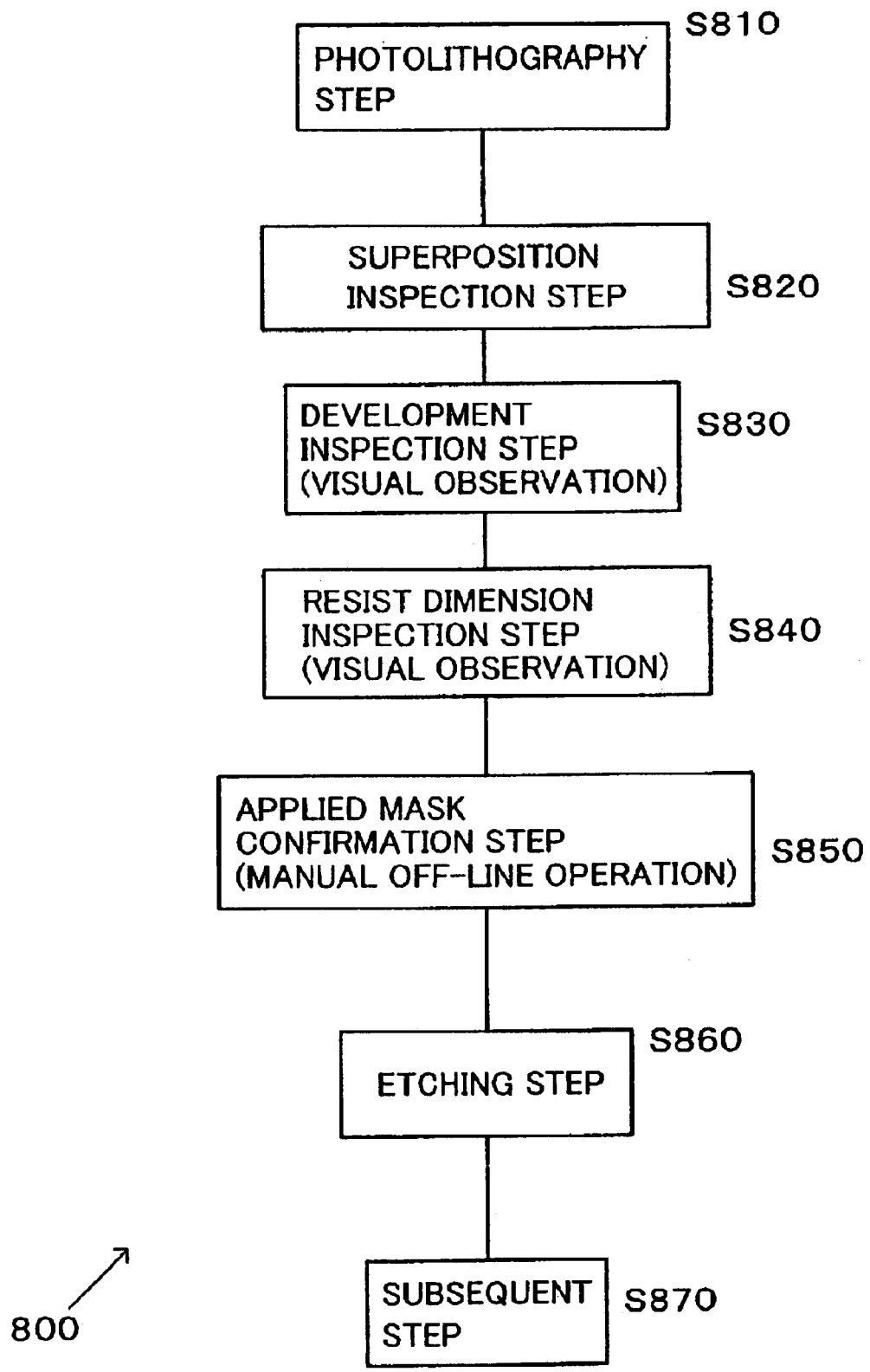
FIG. 15 is a flow chart illustrating a general etching step employing the superposition marks.
Figure 16:
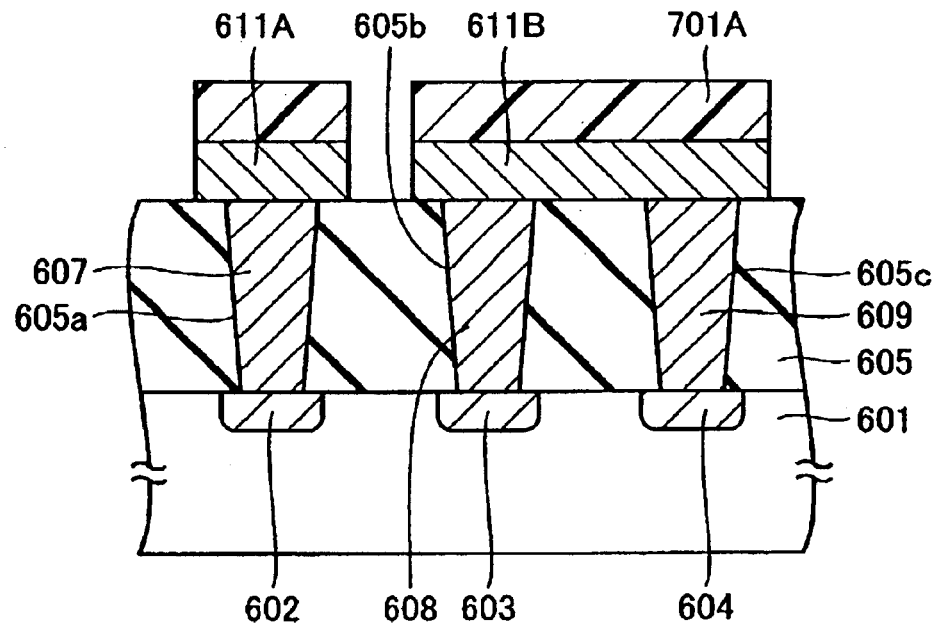
FIG. 16 is a first sectional view showing the structure of a semiconductor device.
Figure 17:
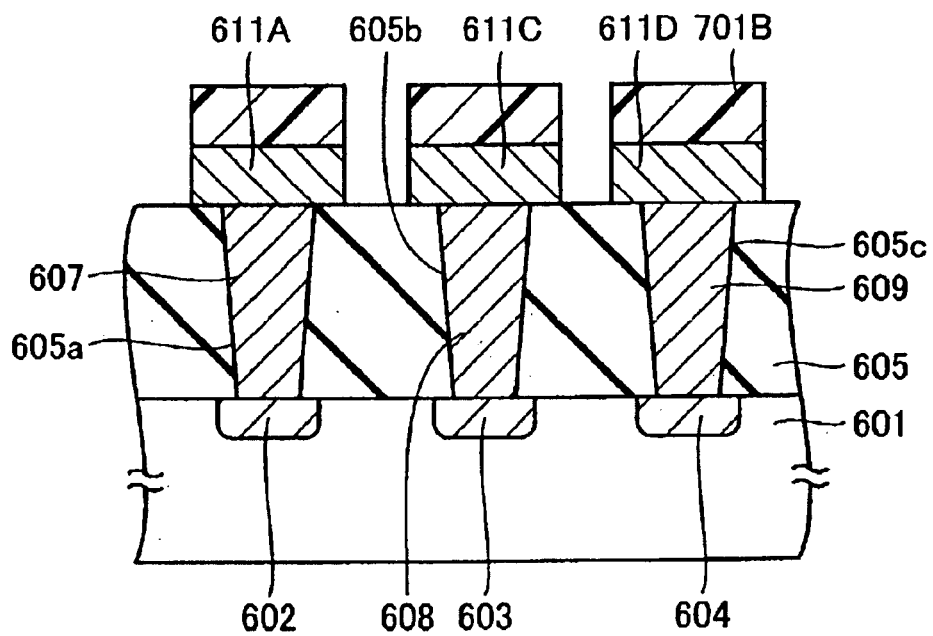
FIG. 17 is a second sectional view showing the structure of another semiconductor device.

Thus, the feature of the first embodiment resides in that the applied mask confirmation step (S102B), manually carried out offline after the resist dimension inspection step in the conventional etching step 800 shown in FIG. 15, is carried out simultaneously with the superposition inspection step with the superposition inspection apparatus (S102A). A method of simultaneously carrying out the superposition inspection step (S102A) and the applied mask confirmation step (S102B) is now described in detail.

Figure 2:
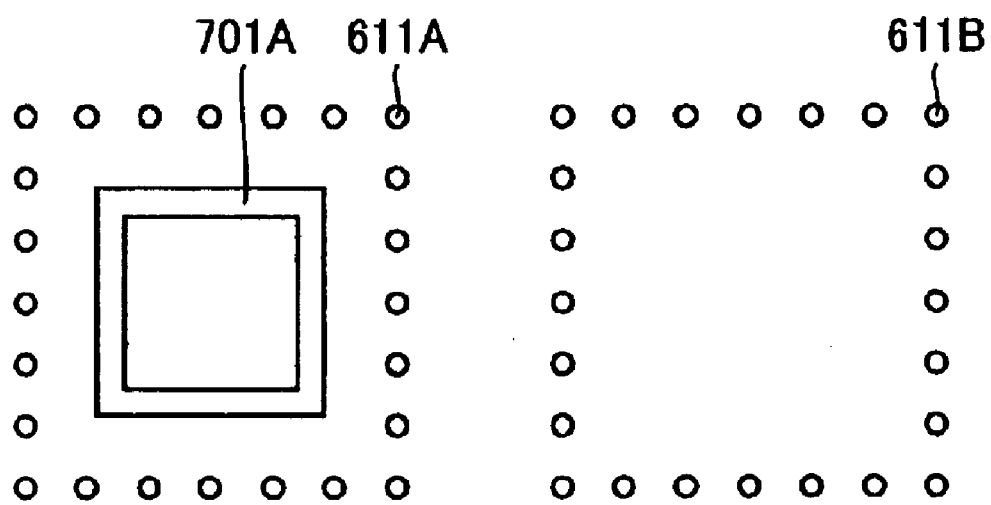
FIGS. 2 and 3 are plan views showing first and second superposition mark regions in the first embodiment.
Figure 3:
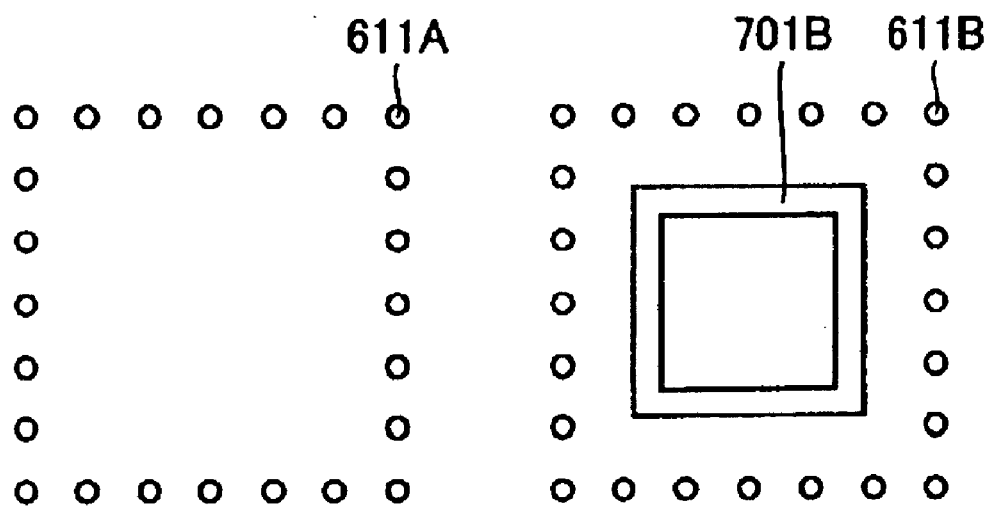

Referring to FIGS. 2 and 3, the superposed layer is provided with a first superposed layer superposition mark 611A and a second superposed layer superposition mark 611b on prescribed positions respectively. The number of the superposed layer superposition marks 611A and 611B is properly selected. The first and second superposed layer superposition marks 611A and 611B are identical in shape etc. to the conventional superposed layer superposition mark 611H shown in FIGS. 13 and 14.

Referring to FIG. 2, a resist film superposition mark 701A transferred to a resist layer through a photomask having a first wiring pattern is provided inside the first superposed layer superposition mark 611A. Referring to FIG. 3, another resist film superposition mark 701b transferred to the resist layer through a photomask having a second wiring pattern is provided inside the second superposed layer superposition mark 611B. The resist film superposition marks 701A and 701B are identical to the conventional resist film superposition mark 701H shown in FIGS. 13 and 14.

Figure 4:
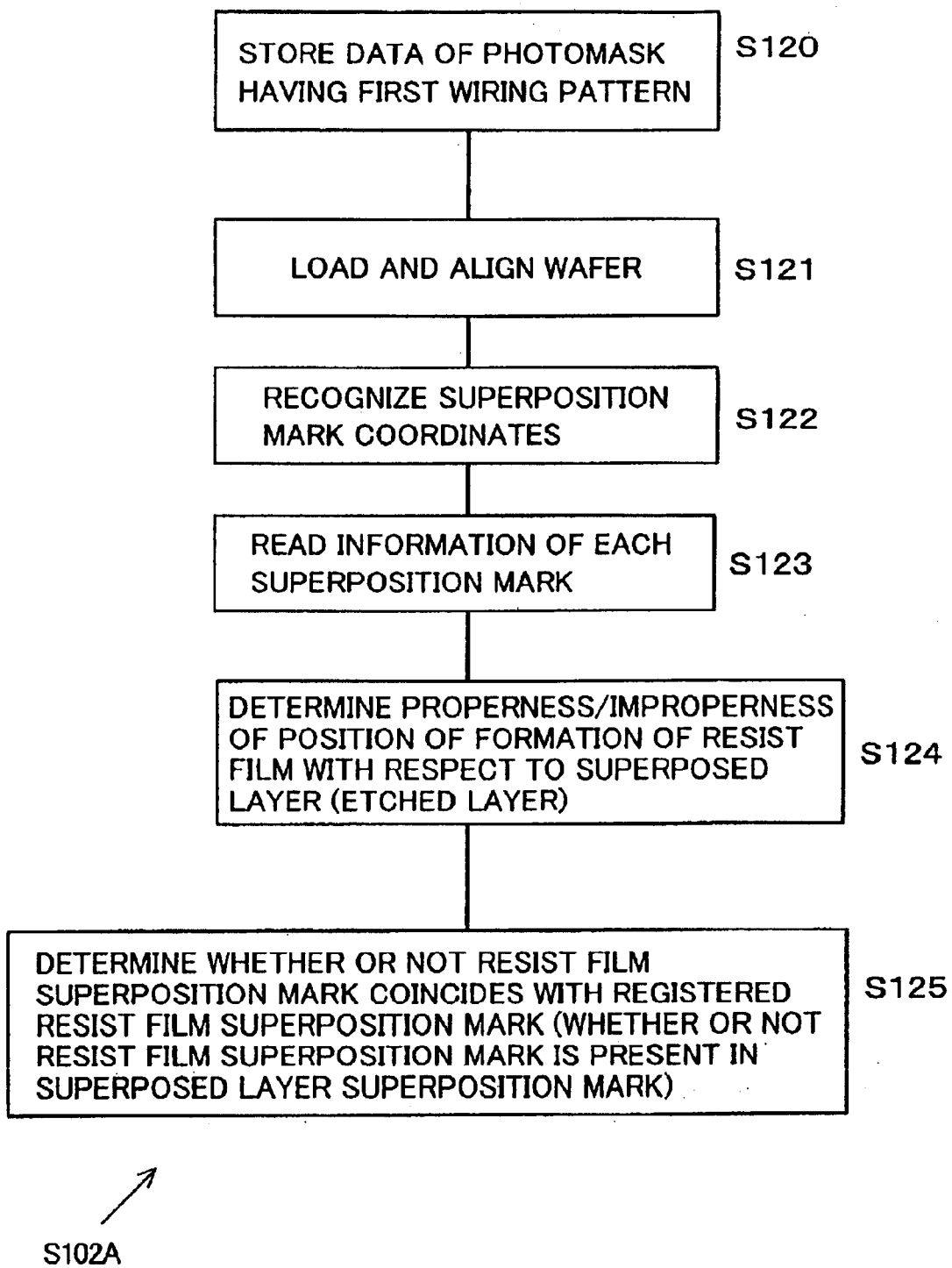
FIG. 4 is a flow chart showing the method of fabricating a semiconductor device including a superposition inspection step according to the first embodiment.

The flow of the method of fabricating a semiconductor device including the superposition inspection step (S102A) in a case of etching an etched layer through the photomask having the first wiring pattern according to the first embodiment is now described with reference to FIG. 4.

First, the superposition inspection apparatus previously stores data of the photomask having the first wiring pattern provided with the resist film superposition mark 701A (S120). Thereafter the superposition inspection apparatus loads and aligns a wafer (S121). Thereafter the superposition inspection apparatus recognizes superposition mark coordinates (S122).

Then, the superposition inspection apparatus reads information of the superposed layer superposition marks 611A and 611B provided on the superposed layer and information of the resist film superposition mark 701A provided on the resist film (S123).

Then, the superposition inspection apparatus reads the positional relation between the superposed layer superposition mark 611A and the resist film superposition mark 701A from the information of the superposed layer superposition marks 611A and 611B and the information of the resist film superposition mark 701A, for determining properness/ improperness of the position of formation of the resist film with respect to the superposed layer (S124).

Then, the superposition inspection apparatus compares the information of the resist film superposition mark 701A with information of a registered resist film superposition mark previously registered therein at the step S120, thereby determining whether or not the resist film superposition mark 701A coincides with the registered resist film superposition mark (S125).

More specifically, the superposition inspection apparatus determines the aforementioned properness/improperness by determining whether or not the resist film superposition mark 701A is present within the superposed layer superposition mark 611A. When the photomask having the second wiring pattern provided with the resist film superposition mark 701B shown in FIG. 3 is falsely mounted on the superposition inspection apparatus, therefore, the superposition inspection apparatus recognizes that no resist film superposition mark 701A is present within the superposed layer superposition mark 611A and informs an operator of the result.

In the method of fabricating a semiconductor device including a superposition inspection step according to the first embodiment, the mark determination step of determining whether or not the resist film superposition mark coincides with the registered resist film superposition mark is carried out simultaneously with the mark position determination step of determining properness/improperness of the position of formation of the resist film with respect to the superposed layer, for improving the working efficiency by determining whether or not the applied photomask is correct in an early stage of the etching step. Further, correctness of the applied photomask is determined not through a manual offline operation but through the online operation employing the superposition inspection apparatus, thereby enabling improvement of the fabrication yield for the semiconductor device with no overlook of false application of the photomask.

According to this embodiment, further, the information based on the position of the resist film superposition mark is employed as the information of the resist film superposition mark, thereby enabling utilization of information employed for determining mark positions in a conventional superposition inspection apparatus.

Second Embodiment

A method of fabricating a semiconductor device including a superposition inspection step according to a second embodiment of the present invention is now described with reference to FIGS. 5 to 7.

The method of fabricating a semiconductor device including a superposition inspection step according to the second embodiment is basically identical to the aforementioned method of fabricating a semiconductor device including a superposition inspection step according to the first embodiment, and hence only difference between these methods is now described.

Figure 5:
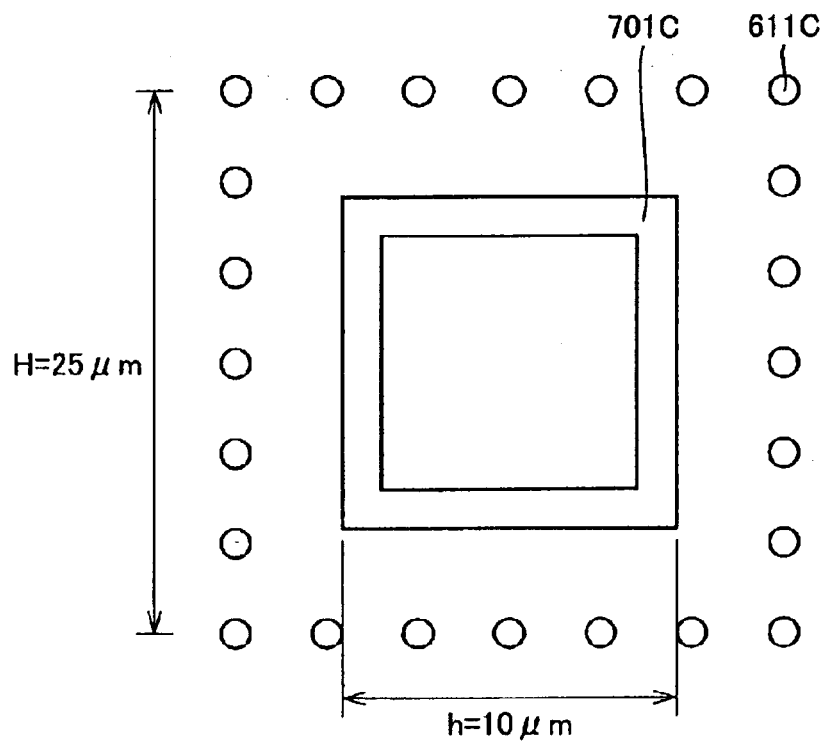
FIGS. 5 and 6 are plan views showing first and second superposition mark regions in a method of fabricating a semiconductor device including a superposition inspection step according to a second embodiment of the present invention.
Figure 6:
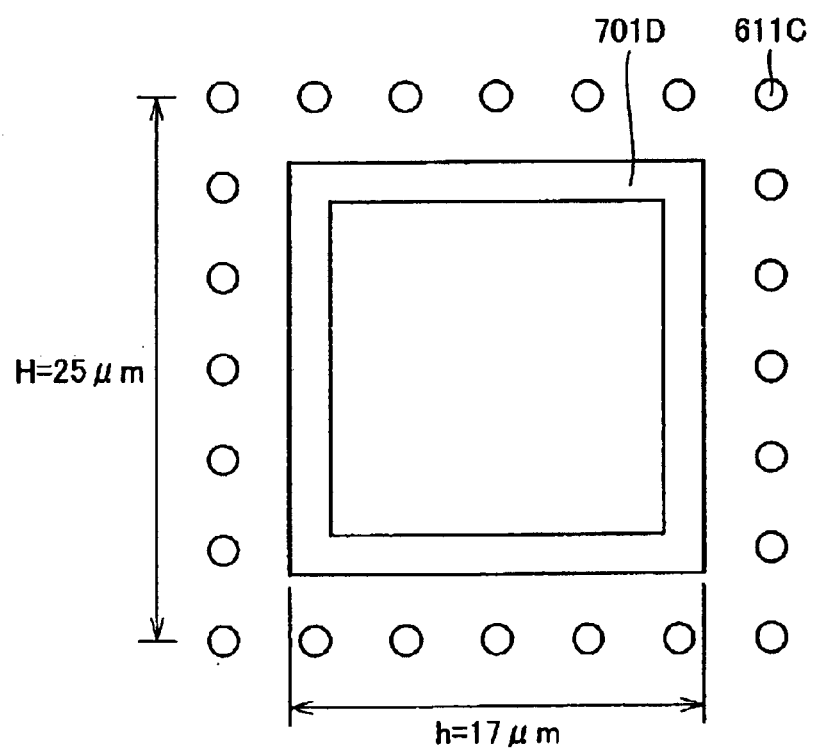
Figure 7:
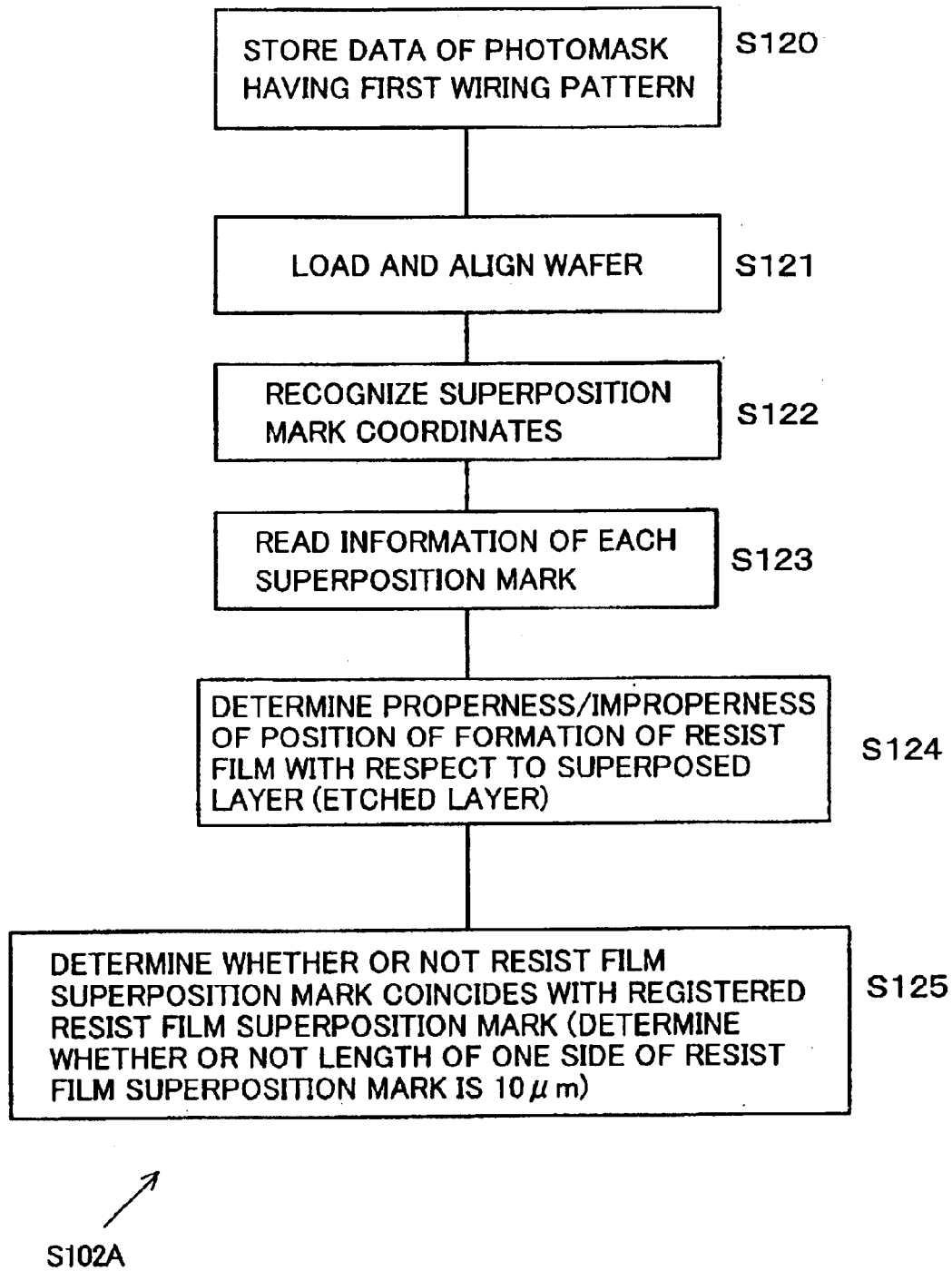
FIG. 7 is a flow chart showing the method of fabricating a semiconductor device including a superposition inspection step according to the second embodiment.

Referring to each of FIGS. 5 and 6, a superposed layer superposition mark 611C is provided on a prescribed position of a superposed layer. The superposed layer superposition mark 611C is identical in dimension, shape etc. to the conventional superposed layer superposition mark 611H shown in FIGS. 13 and 14.

Referring to FIG. 5, a resist film superposition mark 701C transferred to a resist layer through a photomask having a first wiring pattern is in the form of a square provided inside the superposed layer superposition mark 611C, and the dimension (h) of each side thereof is 10 $\mu$m. Referring to FIG. 6, a resist film superposition mark 701D transferred to the resist layer through a photomask having a second wiring pattern is also in the form of a square provided inside the superposed layer superposition mark 611C, and the dimension (h) of each side thereof is 17 $\mu$m. The resist film superposition marks 701C and 701D are identical in shape to the conventional resist film superposition mark 701H shown in FIGS. 13 and 14.

The flow of a superposition inspection step (S102A) for etching an etched layer of a semiconductor device through the photomask having the first wiring pattern according to this embodiment is now described with reference to FIG. 7.

First, a superposition inspection apparatus previously stores data of the photomask having the first wiring pattern provided with the resist film superposition mark 701C (S120). Thereafter the superposition inspection apparatus loads and aligns a wafer (S121). Thereafter the superposition inspection apparatus recognizes superposition mark coordinates (S122).

Then, the superposition inspection apparatus reads information of the superposed layer superposition mark 611 provided on the superposed layer and the information of the resist film superposition mark 701C provided on a resist film (S123).

Then, the superposition inspection apparatus reads the positional relation between the superposed layer superposition marks 611C and the resist film superposition mark 701C from the information of the superposed layer superposition marks 611C and that of the resist film superposition mark 701C for determining properness/improperness of the position of formation of the resist film with respect to the superposed layer (S124).

Then, the superposition inspection apparatus compares the information of the resist film superposition mark 701C with information of a registered resist film superposition mark previously registered therein at the step S120, thereby determining whether or not the resist film superposition mark 701C coincides with the registered resist film superposition mark (S125).

More specifically, the superposition inspection apparatus determines whether or not the length of each side of the resist film superposition mark 701C is 10 $\mu$m. If the photomask having the second wiring pattern provided with the resist film superposition mark 701D shown in FIG. 6 is falsely mounted on the superposition inspection apparatus, therefore, the superposition inspection apparatus recognizes absence of the resist film superposition mark 701C having the sides of 10 $\mu$m in length, and informs an operator of the result.

Also in the method of fabricating a semiconductor device including a superposition inspection step according to the second embodiment, the working efficiency can be improved by determining whether or not the applied photomask is correct in an early stage of the etching step, similarly to the aforementioned first embodiment. Further, correctness of the applied photomask is determined not through a manual offline operation but through the online operation employing the superposition inspection apparatus, thereby enabling improvement of the fabrication yield for the semiconductor device with no overlook of false application of the photomask.

According to this embodiment, further, the information based on the length of each side, i.e., the outside dimension of the resist film superposition mark is employed as the information of the resist film superposition mark, thereby enabling utilization of information employed for determining mark positions in the conventional superposition inspection apparatus.

Third Embodiment

A method of fabricating a semiconductor device including a superposition inspection step according to a third embodiment of the present invention is now described with reference to FIGS. 8 to 10.

The method of fabricating a semiconductor device including a superposition inspection step according to the third embodiment is basically identical to the aforementioned method of fabricating a semiconductor device including a superposition inspection step according to the first embodiment, and hence only difference between these methods is now described.

Figure 8:
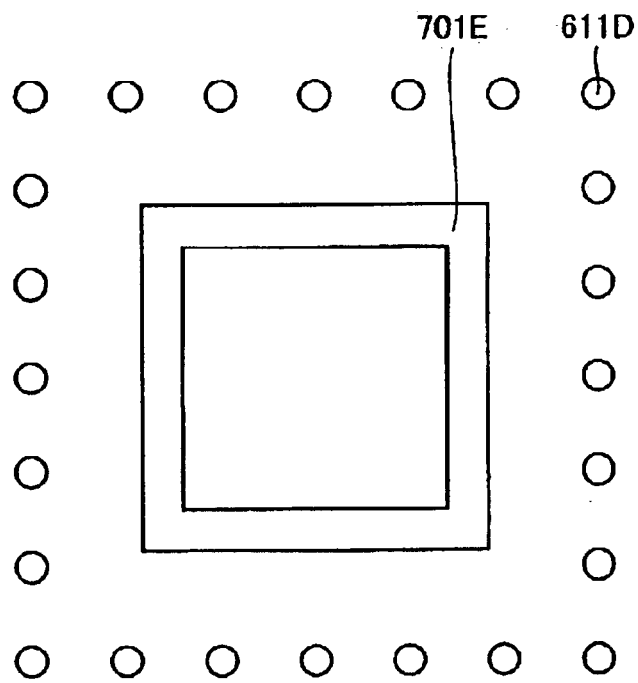
FIGS. 8 and 9 are plan views showing first and second superposition mark regions in a method of fabricating a semiconductor device including a superposition inspection step according to a third embodiment of the present invention.
Figure 9:
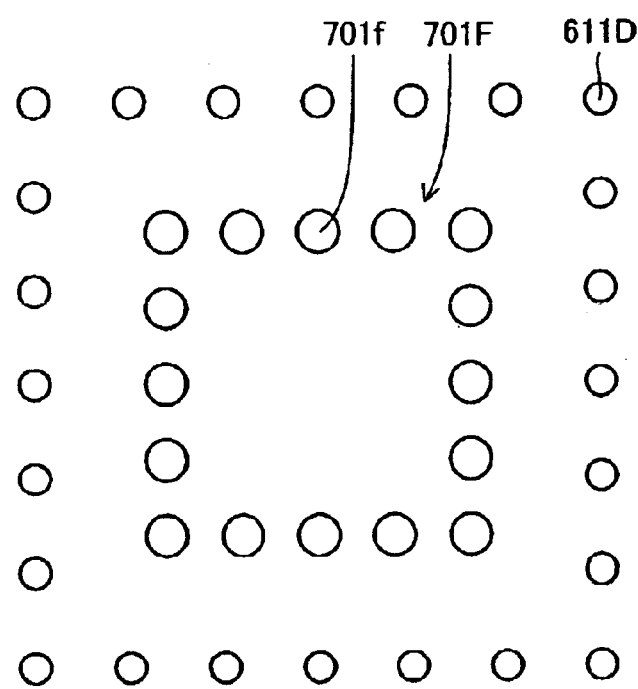
Figure 10:
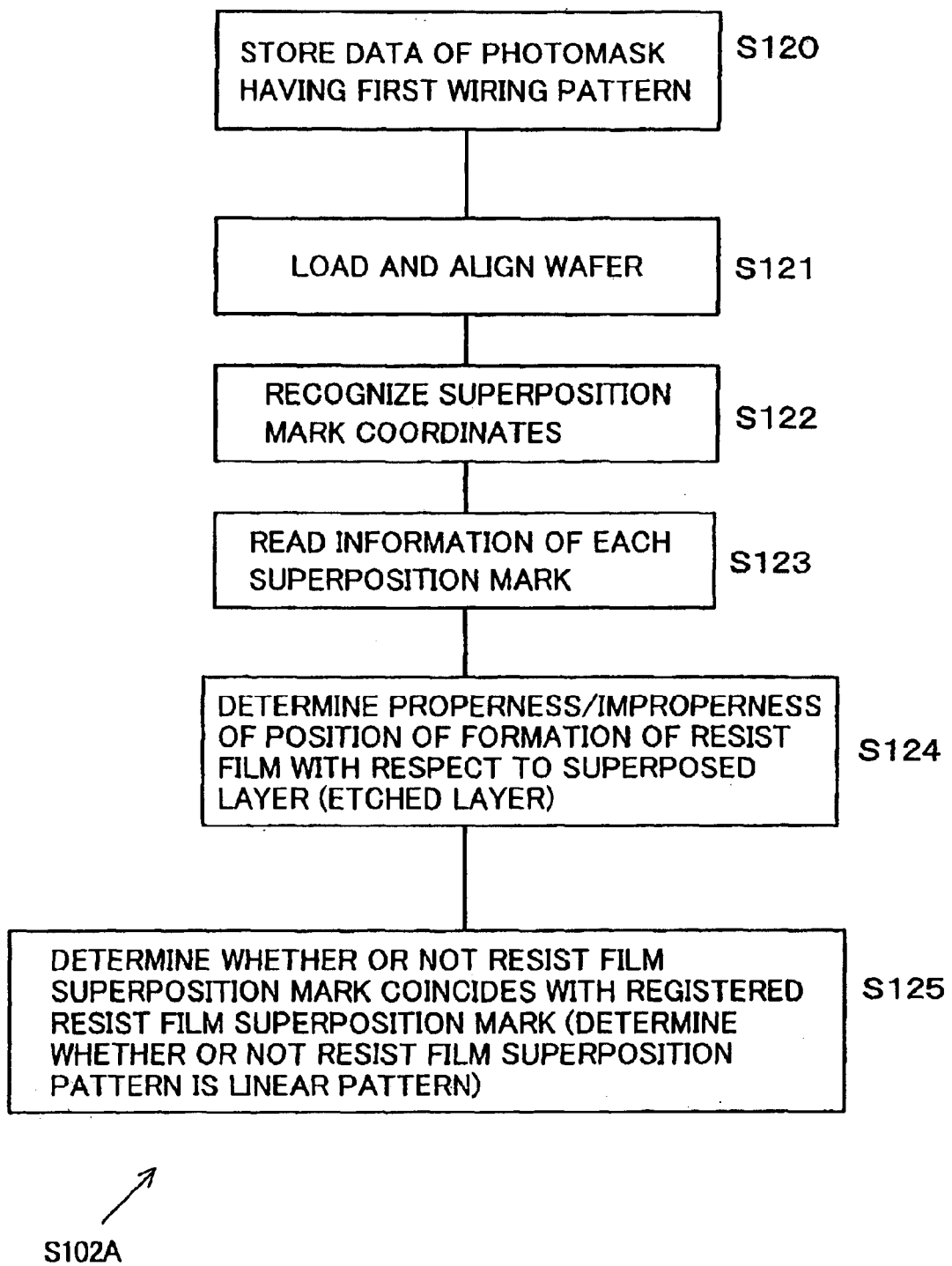
FIG. 10 is a flow chart showing the method of fabricating a semiconductor device including a superposition inspection step according to the third embodiment.

Referring to each of FIGS. 8 and 9, a superposed layer superposition mark 611D is provided on a prescribed position of a superposed layer. The superposed layer superposition mark 611D is identical in dimension, shape etc. to the conventional superposed layer superposition mark 611H shown in FIGS. 13 and 14.

Figure 13:
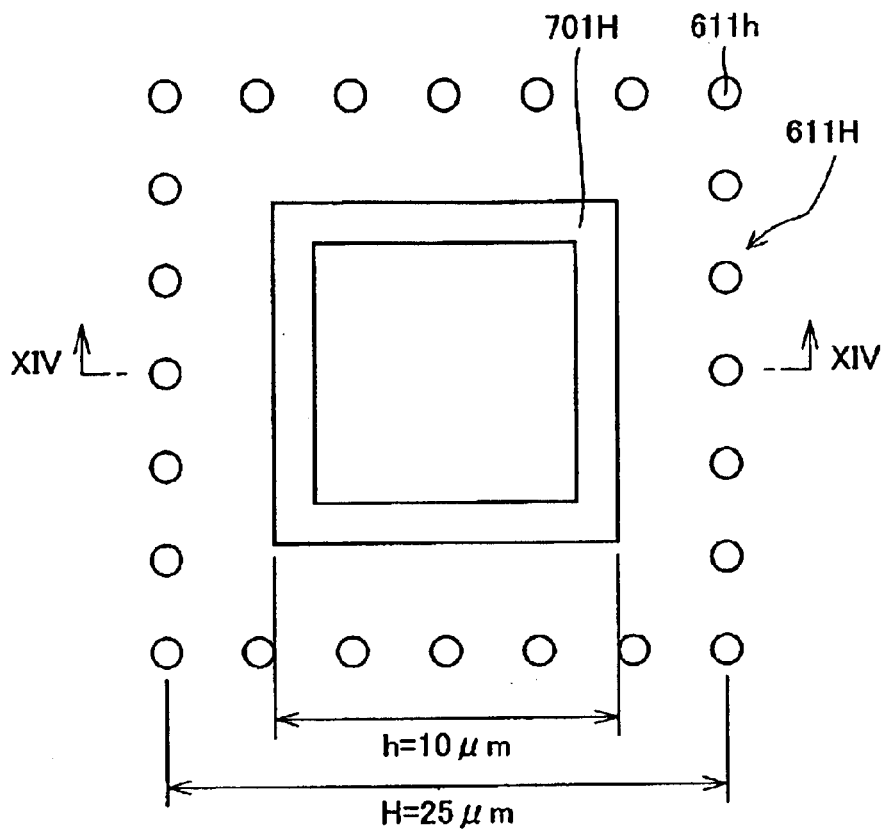
FIG. 13 is a plan view of superposition marks formed on an etched layer and the resist film respectively.
Figure 14:
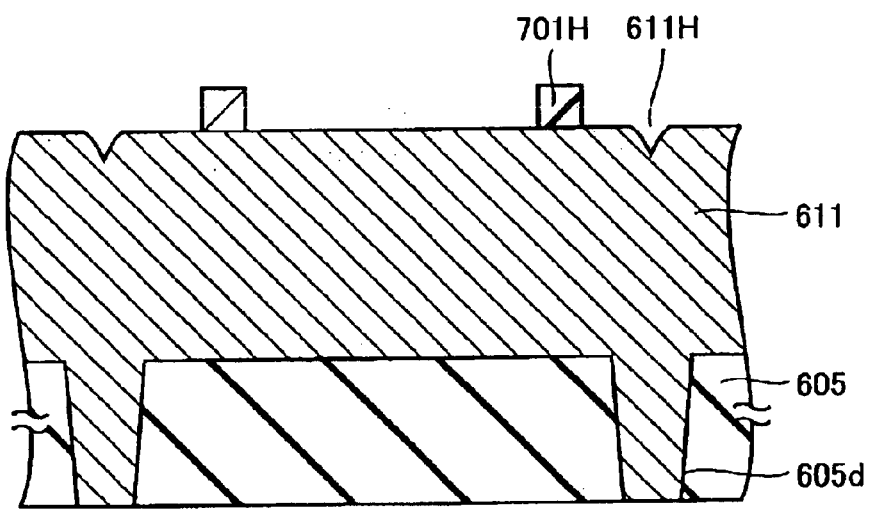
FIG. 14 is a sectional view taken along the line XIV—XIV in FIG. 13.

Referring to FIG. 8, a resist film superposition mark 701E transferred to a resist layer through a photomask having a first wiring pattern is in the form of a square provided inside the superposed layer superposition mark 611D with a dimension (h) of 10 $\mu$m of each side, and linearly patterned similarly to the conventional resist film superposition mark 701H shown in FIGS. 13 and 14.

Referring to FIG. 9, a resist film superposition mark 701F transferred to the resist layer through a photomask having a second wiring pattern is also in the form of a square provided inside the superposed layer superposition mark 611D with a dimension (h) of 10 $\mu$m of each side, while the same is formed by a plurality of recesses 701f.

The flow of the method of fabricating a semiconductor device including a superposition inspection step (S102A) in a case of etching an etched layer of a semiconductor device through the photomask having the first wiring pattern according to this embodiment is now described with reference to FIG. 10.

First, a superposition inspection apparatus previously stores data of the photomask having the first wiring pattern provided with the resist film superposition mark 701E (S120). Thereafter the superposition inspection apparatus loads and aligns a wafer (S121). Thereafter the superposition inspection apparatus recognizes superposition mark coordinates (S122).

Then, the superposition inspection apparatus reads information of the superposed layer superposition mark 611D provided on the superposed layer and the information of the resist film superposition mark 701E provided on a resist film (S123).

Then, the superposition inspection apparatus reads the positional relation between the superposed layer superposition mark 611D and the resist film superposition mark 701E from the information of the superposed layer superposition mark 611D and that of the resist film superposition mark 701E for determining properness/improperness of the position of formation of the resist film with respect to the superposed layer (S124).

Then, the superposition inspection apparatus compares the information of the resist film superposition mark 701E with information of a registered resist film superposition mark previously registered therein at the step S120, thereby determining whether or not the resist film superposition mark 701E coincides with the registered resist film superposition mark (S125).

More specifically, the superposition inspection apparatus determines whether or not the resist film superposition mark 701E is linearly patterned. If the photomask having the second wiring pattern provided with the resist film superposition mark 701F shown in FIG. 9 is falsely mounted on the superposition inspection apparatus, therefore, the superposition inspection apparatus recognizes absence of the linearly patterned resist film superposition mark 701E, and informs an operator of the result.

Also in the method of fabricating a semiconductor device including a superposition inspection step according to the third embodiment, the working efficiency can be improved by determining whether or not the applied photomask is correct in an early stage of the etching step. Further, correctness of the applied photomask is determined not through a manual offline operation but through the online operation employing the superposition inspection apparatus, thereby enabling improvement of the fabrication yield for the semiconductor device with no overlook of false application of the photomask.

According to this embodiment, further, the information based on the pattern shape of the resist film superposition mark is employed as the information of the resist film superposition mark, thereby enabling utilization of information employed for determining mark positions in the conventional superposition inspection apparatus.

Figure 11:
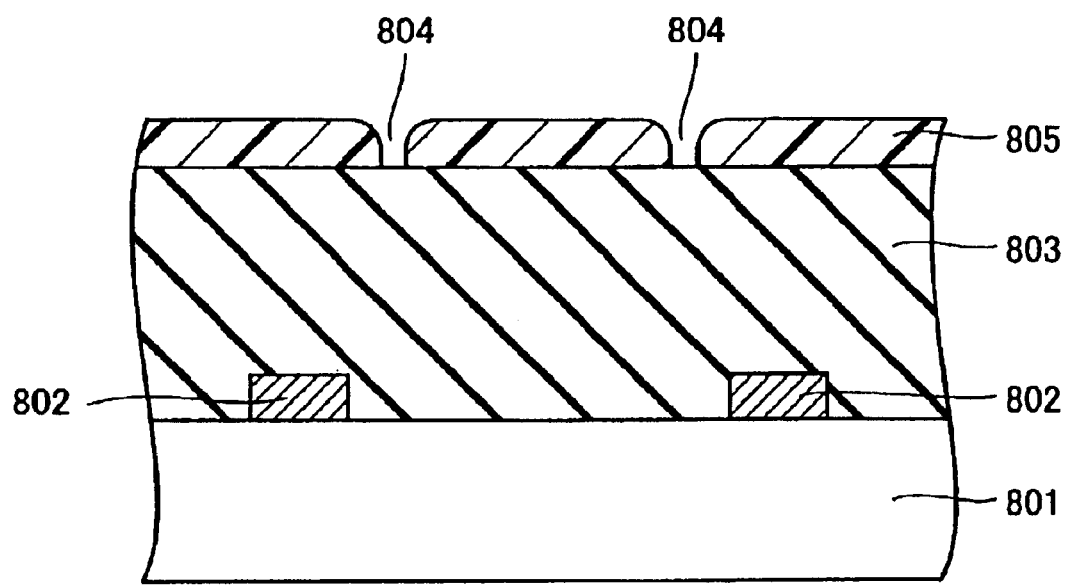
FIG. 11 is a sectional view showing the structure of a semiconductor device in a further embodiment of the present invention.
Figure 12:
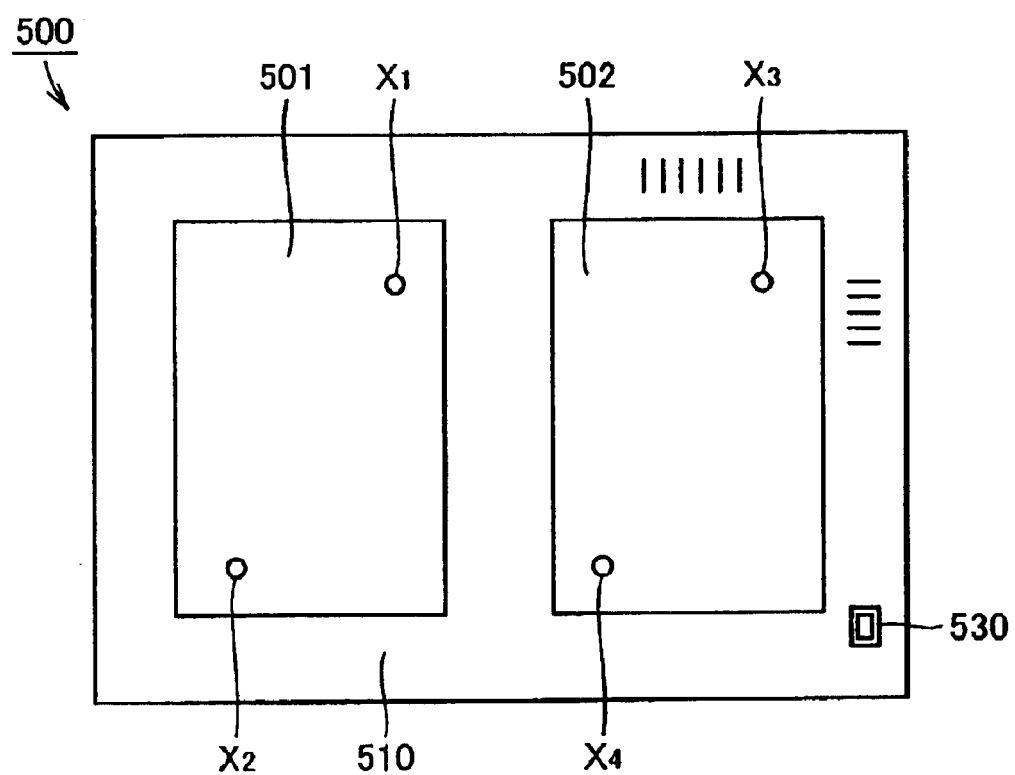
FIG. 12 is a plan view schematically showing the structure of a conventional photomask for transferring prescribed patterns to a resist film.

While the superposition inspection apparatus reads the information of the mark formed on the etched layer provided on the superposed layer to reflect the shape of the superposed layer superposition mark formed on the superposed layer in each of the aforementioned embodiments, the present invention is not restricted to this but is also applicable to a step of fabricating a semiconductor device shown in FIG. 11, for example.

This semiconductor device comprises superposed layer superposition marks 802 provided on a substrate 801 in correspondence to bit lines serving as superposed layers, an interlayer dielectric film 803 formed on the superposed layer superposition marks 802 as an etched layer and a resist film 805 having resist film superposition marks 804 formed on the interlayer dielectric film 803, with no superposed layer superposition marks provided on the etched layer dissimilarly to the structures shown in the aforementioned embodiments.

In the method of fabricating a semiconductor device including a superposition inspection step according to the present invention, the working efficiency can be improved by determining whether or not the applied photomask is correct in an early stage of the etching step. Further, correctness of the applied photomask is determined through the online operation employing the superposition inspection apparatus, thereby enabling improvement of the fabrication yield for the semiconductor device with no overlook of false application of the photomask.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device including a superposition inspection step for determining properness/improperness of a superposed position of a resist film formed on a superposed layer as a superpositive layer with a superposition inspection apparatus, comprising:

a step of reading information of a superposed layer superposition mark provided on said superposed layer;

a step of reading information of a resist film superposition mark provided on said resist film;

a mark position determination step of reading the positional relation between said superposed layer superposition mark and said resist film superposition mark from said information of said superposed layer superposition mark and said information of said resist film superposition mark and determining properness/improperness of the position of formation of said resist film with respect to said superposed layer; and a mark determination step of comparing said information of said resist film superposition mark with information of a registered resist film superposition mark previously registered in said superposition inspection apparatus thereby determining whether or not said resist film superposition mark coincides with said registered resist film superposition mark.

2. The method of fabricating a semiconductor device including a superposition inspection step according to claim 1, wherein
said step of reading said information of said superposed layer superposition mark reads information of a mark formed on an etched layer provided on said superposed layer to reflect the shape of said superposed layer superposition mark.

3. The method of fabricating a semiconductor device including a superposition inspection step according to claim 1, wherein
said information of said resist film superposition mark is information based on the position of said resist film superposition mark.

4. The method of fabricating a semiconductor device including a superposition inspection step according to claim 1, wherein
said information of said resist film superposition mark is information based on the outer dimension of said resist film superposition mark.

5. The method of fabricating a semiconductor device including a superposition inspection step according to claim 1, wherein
said information of said resist film superposition mark is information based on the pattern shape of said resist film superposition mark.

* * * * *